US009236445B2

(12) United States Patent  
Liu et al.

(10) Patent No.: US 9,236,445 B2
(45) Date of Patent: Jan. 12, 2016

(54) TRANSISTOR HAVING REPLACEMENT GATE AND EPITAXIALLY GROWN REPLACEMENT CHANNEL REGION

(71) Applicant: Taiwan Semiconductor Manufacturing Co., Ltd., Hsin-Chu (TW)

(72) Inventors: Chia-Wen Liu, Taipei (TW); Tsung-Hsing Yu, Taipei (TW); Wei-Hao Wu, Hsinchu (TW); Meikei Ieong, Taipei (TW); Ken-Ichi Goto, Hsin-Chu (TW); Zhiqiang Wu, Chubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 48 days.

(21) Appl. No.: 14/156,505

(22) Filed: Jan. 16, 2014

(65) Prior Publication Data

US 2015/0200272 A1    Jul. 16, 2015

(51) Int. Cl.
*H01L 29/78* (2006.01)
*H01L 29/66* (2006.01)
*H01L 29/36* (2006.01)

(52) U.S. Cl.
CPC .......... *H01L 29/66545* (2013.01); *H01L 29/36* (2013.01); *H01L 29/78* (2013.01); *H01L 29/7833* (2013.01)

(58) Field of Classification Search
CPC .............. H01L 29/66545; H01L 29/1054; H01L 29/7848; H01L 29/785; H01L 21/823807; H01L 29/66636; H01L 29/66651; H01L 29/16; H01L 29/165; H01L 29/66477; H01L 29/66795; H01L 21/823431; H01L 21/823821; H01L 21/82382
See application file for complete search history.

(56) References Cited

U.S. PATENT DOCUMENTS

| | | | |
|---|---|---|---|
| 5,355,006 | A | 10/1994 | Iguchi |
| 6,040,208 | A | 3/2000 | Honeycutt et al. |
| 6,215,148 | B1 | 4/2001 | Eitan |
| 6,541,343 | B1 | 4/2003 | Murthy et al. |
| 6,566,204 | B1 | 5/2003 | Wang et al. |
| 6,589,847 | B1 | 7/2003 | Kadosh et al. |
| 6,849,890 | B2 | 2/2005 | Kokubun |
| 7,276,407 | B2 | 10/2007 | Yamagata et al. |
| 7,507,999 | B2 | 3/2009 | Kusumoto et al. |
| 7,943,468 | B2 | 5/2011 | Curello et al. |
| 7,952,149 | B2 | 5/2011 | Dokumaci et al. |

(Continued)

OTHER PUBLICATIONS

Streetman, et al. "Solid State Electronic Devices." Fifth Edition. Published in 2000. pp. 311-315.

(Continued)

*Primary Examiner* — Robert Bachner
(74) *Attorney, Agent, or Firm* — Eschweiler & Associates, LLC

(57) ABSTRACT

The disclosure provides a method of forming a transistor. In this method, a dummy gate structure is formed over a semiconductor substrate. Source/drain regions are then formed in the semiconductor substrate such that a channel region, which is arranged under the dummy gate structure in the semiconductor substrate, separates the source/drains from one another. After the source/drain regions have been formed, the dummy gate structure is removed. After the dummy gate structure has been removed, a surface region of the channel region is removed to form a channel region recess. A replacement channel region is then epitaxially grown in the channel region recess.

20 Claims, 7 Drawing Sheets

(56) References Cited

U.S. PATENT DOCUMENTS

| | | | |
|---|---|---|---|
| 8,034,679 | B1 | 10/2011 | Bulucea |
| 8,298,895 | B1 | 10/2012 | Alptekin |
| 8,404,546 | B2 | 3/2013 | Woon et al. |
| 8,557,659 | B2 | 10/2013 | Teo et al. |
| 8,569,156 | B1 | 10/2013 | Scudder et al. |
| 8,659,054 | B2 | 2/2014 | Rim et al. |
| 8,669,615 | B1 | 3/2014 | Chang et al. |
| 2002/0033511 | A1 | 3/2002 | Babcock et al. |
| 2003/0008484 | A1 | 1/2003 | Hook |
| 2003/0075719 | A1 | 4/2003 | Sriram |
| 2005/0023535 | A1 | 2/2005 | Sriram |
| 2005/0173739 | A1 | 8/2005 | Kusumoto et al. |
| 2005/0285212 | A1 | 12/2005 | Tolchinsky et al. |
| 2006/0065937 | A1 | 3/2006 | Hoffmann et al. |
| 2006/0220098 | A1 | 10/2006 | Lee et al. |
| 2007/0190731 | A1 | 8/2007 | Chen et al. |
| 2008/0242032 | A1 | 10/2008 | Chakravarthi et al. |
| 2009/0289280 | A1 | 11/2009 | Zhang et al. |
| 2010/0317169 | A1 | 12/2010 | Sung et al. |
| 2010/0330763 | A1 | 12/2010 | Freeman et al. |
| 2011/0079861 | A1 | 4/2011 | Shifren et al. |
| 2011/0215376 | A1 | 9/2011 | Holt et al. |
| 2012/0135575 | A1 | 5/2012 | Wong et al. |
| 2013/0113041 | A1 | 5/2013 | Liu et al. |
| 2014/0197411 | A1 | 7/2014 | Vakada et al. |
| 2014/0252504 | A1 | 9/2014 | Chuang et al. |
| 2015/0243759 | A1 | 8/2015 | Huang et al. |

OTHER PUBLICATIONS

U.S. Appl. No. 14/156,496, filed Jan. 16, 2014. 27 Pages.
U.S. Appl. No. 14/156,515, filed Jan. 16, 2014. 31 Pages.
U.S. Appl. No. 14/156,546, filed Jan. 16, 2014. 29 Pages.
Non Final Office Action Dated Feb. 23, 2015 U.S. Appl. No. 14/156,546.
U.S. Appl. No. 14/208,353, filed Mar. 13, 2014.
Chih-Cheng Lu, et al.; "Strained Silicon Technology: Mobility Enhancement and Improved Short Channel Effect Performance by Stress Memorization Technique on nFET Devices"; Journal of the Electrochemical Society; Oct. 8, 2009, p. 1-4.
S. Flachowsky, et al.; "Stress Memorization Technique for n-MOSFETs: Where is the Stress Memorized?"; ULIS 2010—Ultimate Integration on Silicon; University of Glasgow; Mar. 2010; p. 1-4.
Nuo Xu; "Effectiveness of Strain Solutions for Next-Generation MOSFETs"; University of California—Berkley; Spring 2012; p. 1-103.
Shen, et al. "Molecular Dynamic Simulation Study of Stress Memorization in Si Dislocations." IEEE International Conference: Electron Devices Meeting (IEDM), 2012.
U.S. Appl. No. 13/288,201, filed Nov. 3, 2011.
U.S. Appl. No. 14/252,147, filed Apr. 14, 2014.
Non Final Office Action Dated May 15, 2015 U.S. Appl. No. 14/156,515.
Notice of Allowance dated Jun. 26, 2015 for U.S. Appl. No. 14/156,546.
Notice of Allowance Dated Jul. 24, 2015 U.S. Appl. No. 14/252,147.
Notice of Allowance Dated Aug. 27, 2015 U.S. Appl. No. 14/156,515.
Non Final Office Action Dated Aug. 28, 2015 U.S. Appl. No. 14/208,353.
Non Final Office Action Dated Nov. 27, 2015 U.S. Appl. No. 14/156,496.

TRANSISTOR HAVING REPLACEMENT GATE AND EPITAXIALLY GROWN REPLACEMENT CHANNEL REGION

BACKGROUND

Transistors are highly utilized components for amplifying or switching electronic signals in integrated circuits. Transistors may be N-type transistors with N-type transistor channels, or P-type transistors with P-type transistor channels. Transistors may be formed using various techniques and materials, but require accurate and precise placement of their various components and constituents to operate optimally and efficiently, especially as dimensions continue to shrink to meet advanced integration requirements. One such constituent is the dopant impurities that are introduced into the channel region because they directly influence the functionality and performance of the transistor device. The characteristics and location of the dopant impurities, i.e. the dopant profile, must be carefully controlled.

A multitude of separate processing operations are used to form the structural features of transistors and to set the dopant impurities at proper concentration levels, in the transistor channel and other regions such as the source/drain regions. Fluctuations in any of these processing operations can cause variation in the transistor device and performance degradation. This is especially true with respect to the operations used to introduce and place dopant impurities in the transistor channel, pocket implant regions, and other regions such as the source/drain regions. It would therefore be desirable to provide transistor devices with well-controlled dopant impurity profiles.

DETAILED DESCRIPTION

Figure 1:
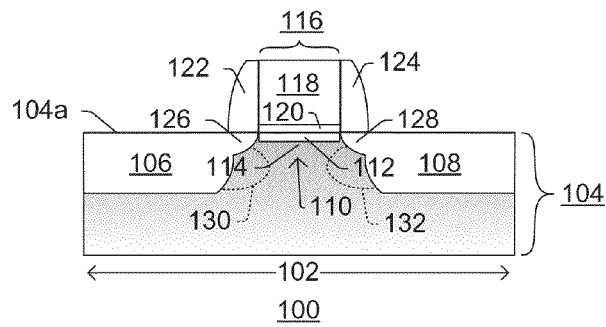
FIG. 1 illustrates a cross-sectional view of a transistor having a replacement gate and epitaxially grown replacement channel region.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

The present disclosure relates to transistor fabrication techniques that utilize a replacement gate and an epitaxially grown replacement channel. The replacement gate and replacement channel are formed after a dummy gate has been removed and a recess has been formed in an initial channel region under the location of the removed dummy gate. Several manufacturing operations, such as forming source/drain regions, spacers, and LDD regions for example, can be carried out with the dummy gate in place prior to the formation of the replacement gate and replacement channel. By forming the replacement gate and replacement channel after these manufacturing operations have been carried out, the thermal stresses applied to the replacement channel is reduced relative to conventional solutions that do not employ a replacement channel. Therefore, tighter doping profiles across semiconductor process lots can be achieved. In particular, threshold voltage or drive current for transistors spread over the semiconductor process lots can exhibit less variation than that with conventional processes, thereby enabling higher yields than conventionally achievable.

FIG. 1 is a cross-sectional view showing a semiconductor transistor 100 which can be formed on an integrated circuit in accordance with some embodiments. The transistor 100 is formed on an active area 102 of a semiconductor substrate 104, wherein the active area 102 has a first conductivity type (e.g., p-type). Source/drain regions 106, 108, which have a second conductivity type (e.g., n-type), are arranged in the semiconductor substrate 104. A channel region 110, which has the first conductivity type (e.g., p-type), is arranged in the semiconductor substrate 104 so as to laterally space the source/drain regions 106, 108 from one another. A replacement gate structure 116 is arranged over the channel region 110. The replacement gate structure 116 includes a conductive gate electrode 118 and a gate dielectric 120, which separates the gate conductive electrode 118 from the channel region 110. Lightly doped drain (LDD) regions 126, 128 which have the second conductivity type (e.g., n-type), and halo implant regions 130, 132 which can have the first conductivity type (e.g., p-type), as well as sidewall spacers 122, 124, can also be present in some implementations.

Notably, the channel region 110 includes an upper, epitaxial replacement channel region 112 and a lower (e.g., bulk) substrate channel region 114; both of which are beneath substrate surface 104a. The upper, epitaxial replacement channel region 112 has edges which are substantially aligned to sidewalls of gate electrode 118 and/or sidewalls of gate dielectric 120. The epitaxial replacement channel region 112 can have a depth of between 5 nm and 10 nm in some embodiments.

As will be appreciated in more detail herein, because the epitaxial replacement channel region 112 is formed after the source/drain regions 106, 108, and after spacers 122, 124, among others; the doping profile of the replacement channel region 112 has less process variation over a large number of devices due to the limited thermal exposure, relative to conventional channel regions that are solely bulk substrate regions. Because doping profiles for conventional solely bulk channel regions are formed earlier in the process (relative to the disclosed epitaxially grown replacement channel region 112), the solely bulk channel regions are subject to greater thermal exposure, and correspondingly greater doping profile variation, relative to the disclosed techniques. The end result is that the disclosed epitaxially grown replacement channel region 112 provides a super-steep channel doping profile which promotes ultra-low variability for transistors' threshold voltage and drive current over a large number of devices. This "tighter" variation for threshold voltage and drive current can result in products that better meet performance metrics (e.g., higher yield).

Figure 2:
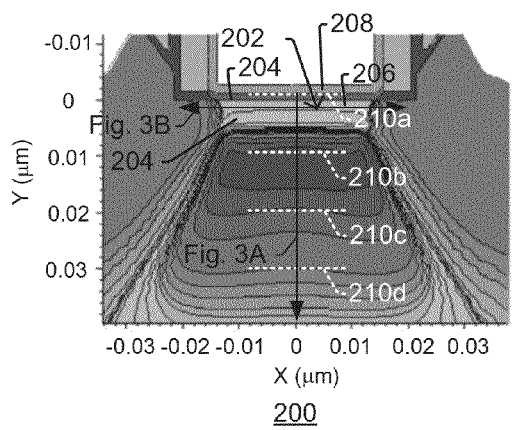
FIG. 2 illustrates a cross-sectional view of a channel dopant profile in accordance with some embodiments.

FIG. 2 is a cross-sectional view showing an exemplary transistor 200 which more clearly illustrates details of the substrate dopant profile, particularly within channel region 202. In the following example where transistor 200 is discussed as being an NMOS transistor, the channel region 202 is formed of P-type dopant impurities, however in other embodiments the transistor 200 can be a PMOS transistor and channel region 202 can be formed of N-type dopant impurities, provided the dopant impurities of the other regions are also "flipped" to opposite conductivity types. Interface 204 is formed between the silicon of upper replacement channel region 206 and gate dielectric 208 over channel region 202.

Figure 3A:
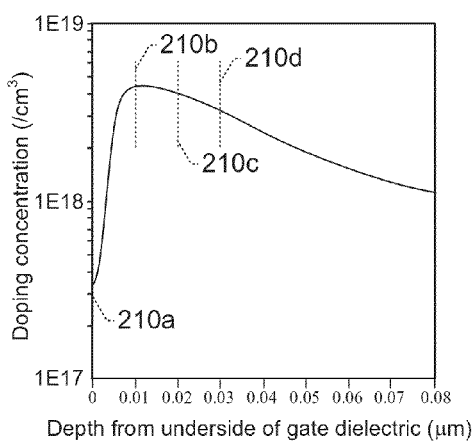
FIG. 3A illustrates a chart illustrating dopant concentration of a transistor channel region as a function of depth in accordance with some embodiments.
Figure 3B:
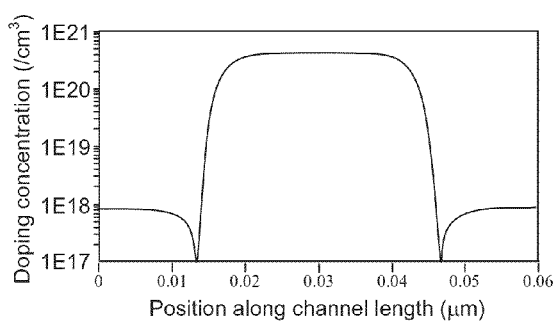
FIG. 3B illustrates a chart illustrating dopant concentration of a transistor channel region as a function of lateral position along a transistor channel region in accordance with some embodiments.

The dopant profile in channel region 202 is shown graphically in FIGS. 3A-3B, each of which represents an exemplary embodiment and neither of which is intended to be limiting of the transistor formed according to the disclosure. FIG. 3A is a graph showing dopant impurity concentration as a function of depth into substrate taken along the line illustrated in FIG. 2. For clarity, lines 210a, 210b, 210c, and 210d illustrate doping concentrations in FIG. 3A and corresponding depth positions in FIG. 2. FIG. 3A's graph starts from interface 204 of FIG. 2, i.e. depth=0 signifies the interface 204. FIG. 3B shows dopant concentration as a function of position along the channel 202 just below interface 204, which is in a silicon epitaxially grown replacement channel layer having a steep doping profile.

FIG. 3A also shows that the peak dopant impurity concentration occurs about 5 nm to 20 nm below interface 204 and is located at about 10 nm from the silicon surface in the exemplary graph. For this first about 10 nm of depth, the dopant concentration is extremely "steep", having an increase in dopant concentration as a function of depth representing an increase of about 1 order of magnitude (i.e., approximately a factor of ten) of concentration per about 10 nm of channel depth. After this first approximately 10 nm of depth, the doping concentration decreases at a much slower rate as the depth increases.

Figure 4:
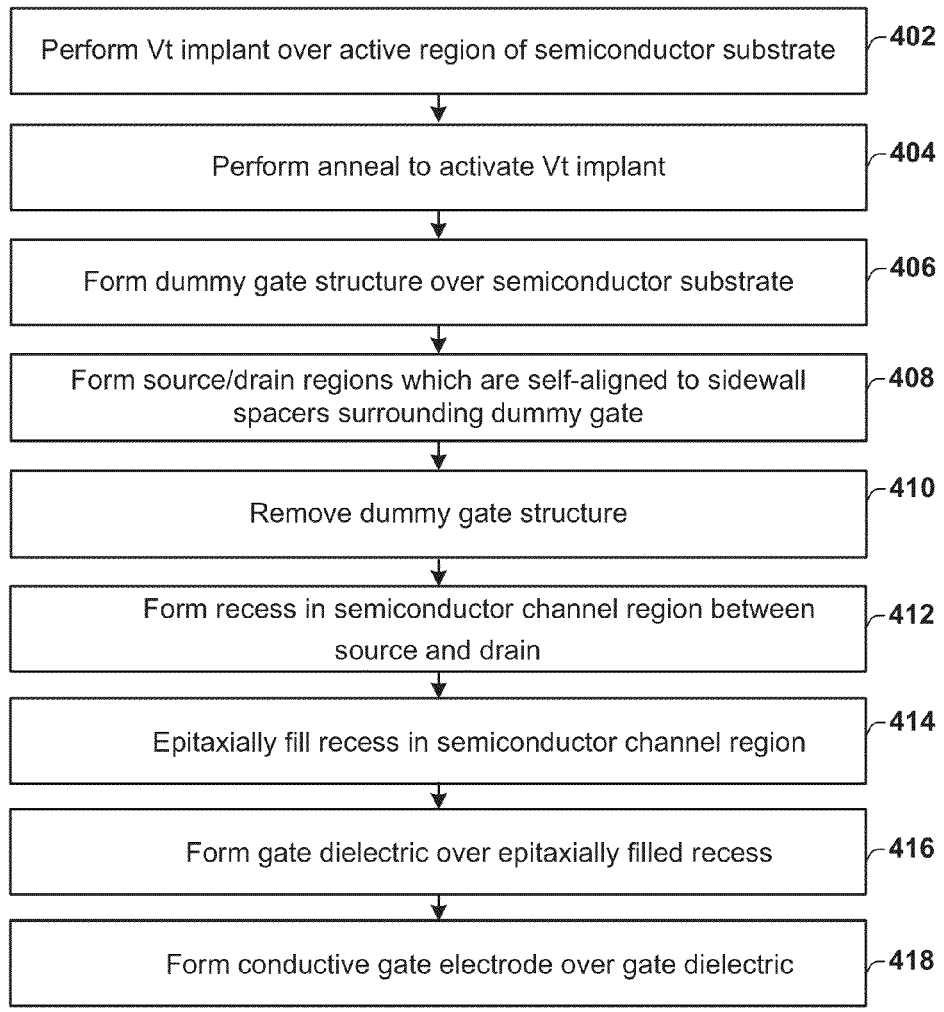
FIG. 4 is a flow diagram of a more general embodiment of a method of forming a semiconductor device.
Figure 5:
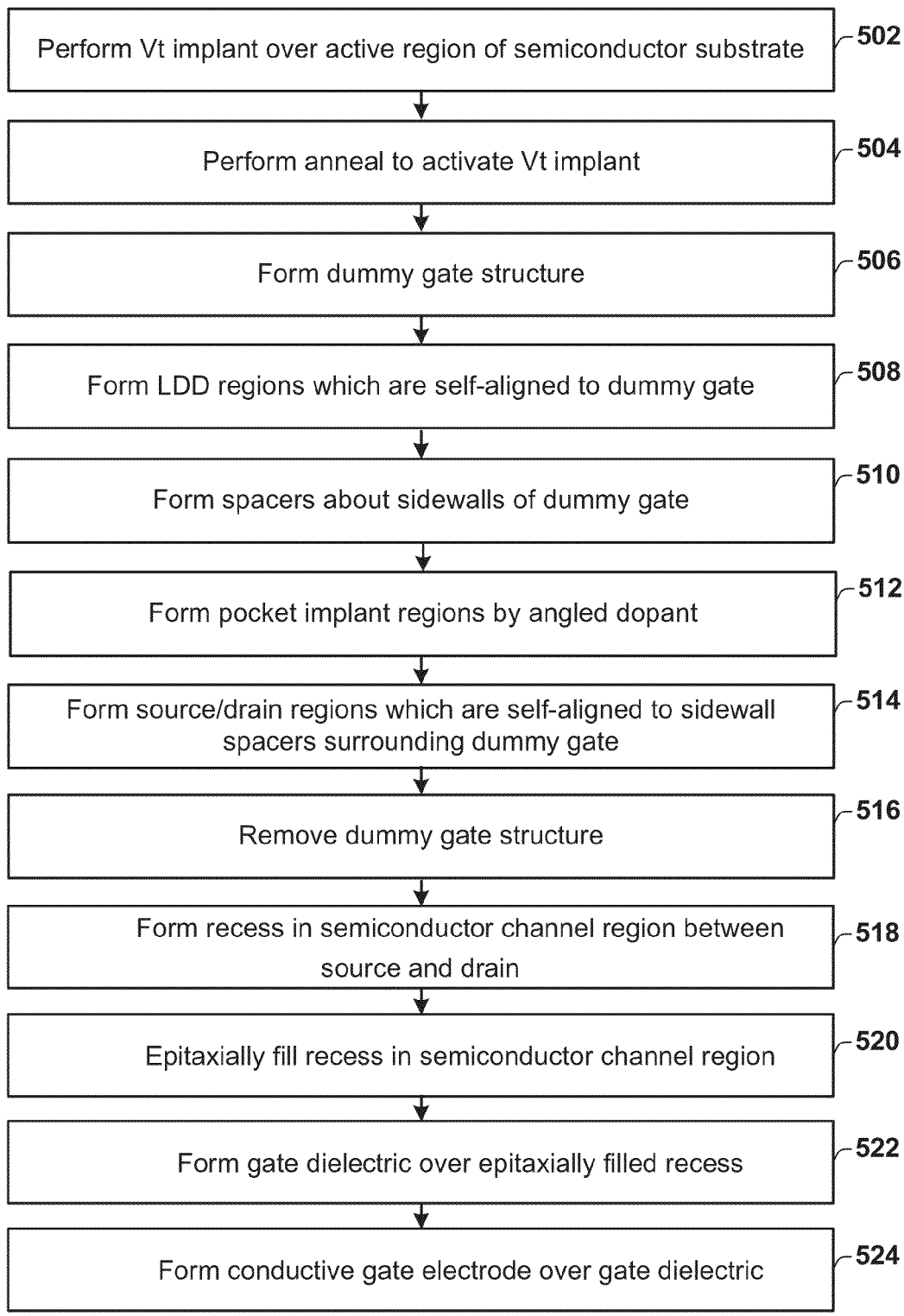
FIG. 5 is a flow diagram of a more detailed embodiment of a method of forming a semiconductor device.

FIG. 4 illustrates a flow diagram of a more general embodiment of a method 400 of forming a semiconductor device; while FIG. 5 illustrates a more detailed method 500 of forming a semiconductor device. Although these methods 400, 500 as well as other included in this disclosure may be illustrated and described as a series of acts or events, it will be appreciated that the illustrated ordering of such acts or events are not to be interpreted in a limiting sense. For example, although the illustrated acts or events may occur one after another in time according to the acts or events illustrated in the figures in some instances, in other instances some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

FIG. 4's flow chart starts at 402 when a threshold voltage (Vt) implant is performed over an active region of semiconductor substrate. In 404, anneal is performed to activate Vt implant. In 406, a dummy gate structure is formed over semiconductor substrate. In 408, source/drain regions, which are self-aligned to sidewall spacers surrounding dummy gate, are formed. In 410, the dummy gate structure is removed. In 412, a recess is formed in semiconductor channel region between source and drain. In 414, the method epitaxially fills the recess in semiconductor channel region. In 416, a gate dielectric is formed over the epitaxially filled recess. In 418, conductive gate electrodes are formed over the gate dielectric.

FIG. 5 is similar to FIG. 4 in some regards, but also includes formation of sidewall spacers, LDD regions, and pocket or halo implants. FIG. 5's flow chart starts at 502 when a threshold voltage (Vt) implant is performed over an active region of semiconductor substrate. In 504, anneal is performed to activate Vt implant. In 506, a dummy gate structure is formed over semiconductor substrate. In 508, LDD regions, which are self-aligned to outer edges of the dummy gate, are formed. In 510, spacers are formed on the outer sidewalls of the dummy gate. In 512, pocket implant regions are formed by performing an angled implant. In 514, source/drain regions are formed which are self-aligned to outer edges of the sidewall spacers. In 516, the dummy gate structure is removed. In 518, a channel recess is formed in semiconductor channel region between source and drain. In 520, the channel recess is epitaxially filled. In 522, a gate dielectric is formed over epitaxially filled recess. In 524, a conductive gate electrode is formed over the gate dielectric.

Referring now to FIGS. 6-14, one can see a series of cross-sectional views that collectively depict a method of manufacturing a semiconductor device consistent with FIG. 5's methodology. Although these cross-sectional views depict one more detailed example consistent with FIG. 5's methodology, it will be appreciated that these cross-sectional views are not limiting, and that other structural features could also be used in place of those illustrated.

Figure 6:
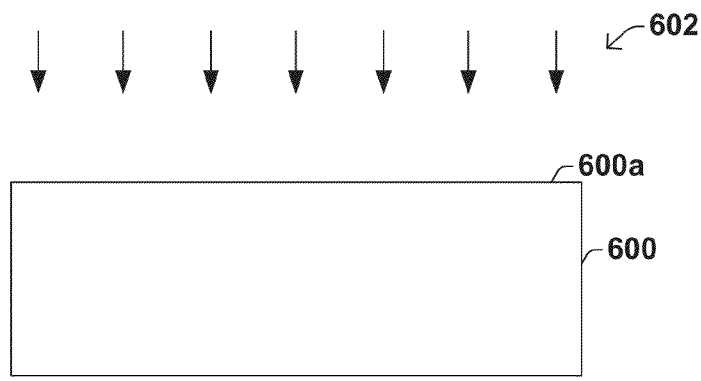
FIGS. 6-17 show a series of cross-sectional views that collectively depict a method of manufacturing a semiconductor device consistent with FIG. 5's methodology.

FIG. 6 shows a threshold voltage ($V_t$) implant operation used to introduce dopant impurities into substrate 600, particularly in an active region within which the transistor channel will be formed. Arrows 602 indicate the introduction of the dopant impurities, which may be P-type dopant impurities such as boron or other suitable species, according to one exemplary embodiment, and may be N-type dopant impurities such as phosphorous, antimony, or arsenic, according to other exemplary embodiments. In some embodiments, the $V_t$ implant can be used to achieve a doping profile of approximately $3 \times 10^{18}$ to approximately $1 \times 10^{19}$ impurities/cm$^3$ in the substrate, which is higher than with conventional approaches. This is because a higher channel doping limits the amount of pocket doping required and thereby limits variation due to pocket doping to provide less process variability. An optional mask layer (not shown), such as an oxide having a thickness of about 50 angstroms to about 100 angstroms, for example, may be formed over top substrate surface 600a in various exemplary embodiments. The $V_t$ implant introduces dopant impurities of a first dopant impurity type (either N-type or P-type) to active region to adjust the $V_t$ applied to the transistor to open the channel to current flow.

Figure 7:
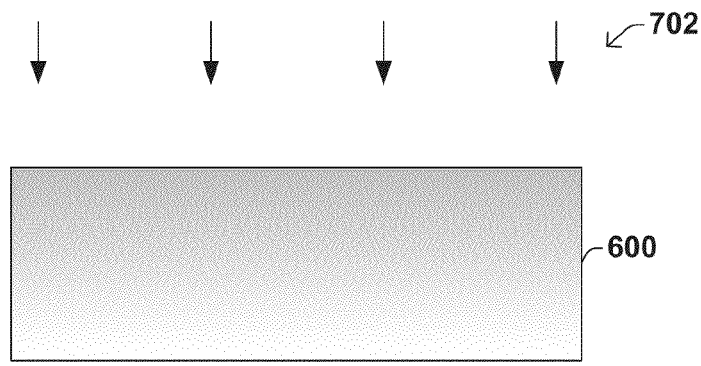

In FIG. 7, after the $V_t$ implant operation is carried out, an annealing operation 702 is performed to activate the introduced dopants, cure crystalline defects, and cause diffusion and redistribution of dopant impurities. Various conventional annealing operations may be used to drive the implanted dopant impurities deeper into semiconductor substrate 600 as indicated by darkness gradient of FIG. 7.

Figure 8:
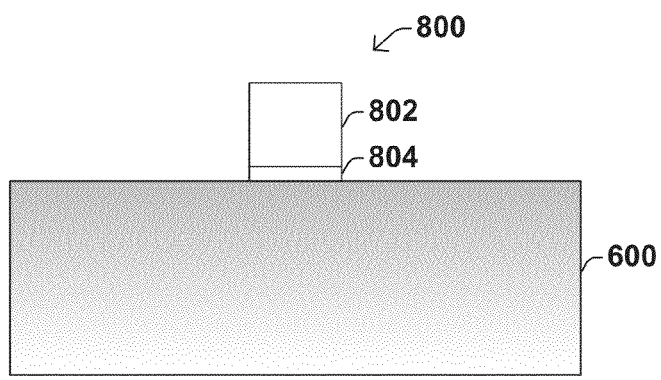

In FIG. 8, a dummy gate stack 800 has been formed over part of the active region of the substrate 600. The gate stack 800 can include dummy gate electrode 802 and optional gate dielectric 804. In some embodiments, the dummy gate electrode is a polysilicon gate and the optional gate dielectric is a high-k dielectric. In particular, the edges of dummy gate stack 800 are aligned with edges of a channel region, which is arranged within semiconductor substrate 600.

Figure 9:
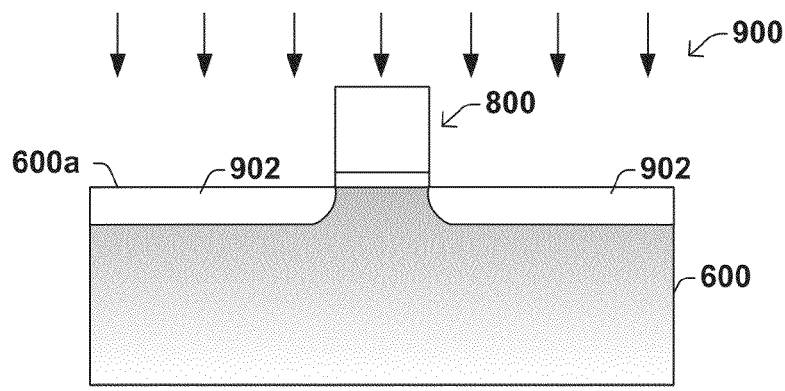

In FIG. 9, with the dummy gate stack 800 in place, an LDD implant operation 900 is then carried out. A lightly doped drain, LDD, operation may be used to form LDD impurity region 902 within semiconductor substrate 600. The LDD operations introduce dopant impurities through upper surface 600a. The LDD dopant introduction operation and LDD structure 902 is formed of a second conductivity type, opposite the first impurity type of the $V_t$ implant shown in FIG. 6.

Figure 10:
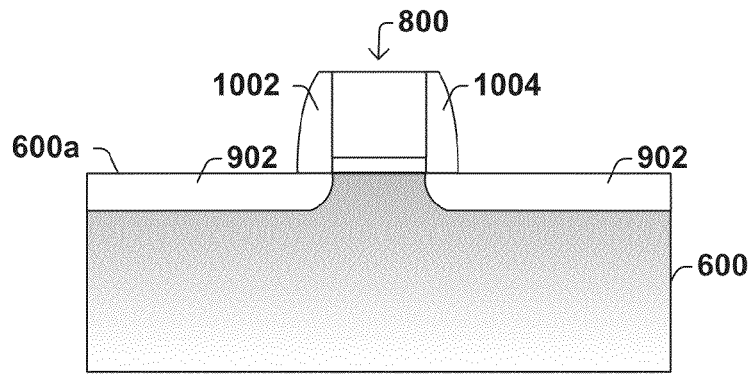

In FIG. 10, spacers 1002, 1004 have been formed. The spacers 1002, 1004 may, for example, be formed of silicon nitride. The spacers extend over a portion of the LDD region 902.

Figure 11:
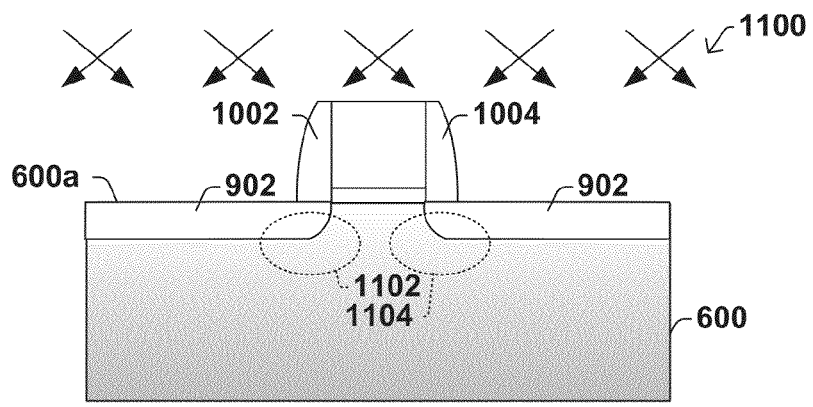

In FIG. 11, "halo" or "pocket" implant regions 1102, 1104 are formed by carrying out an angled ion implantation operation indicated by arrows 1100. Tilt angle may be 20 degrees or less with respect to the vertical, according to various exemplary embodiments. The halo implantation operation introduces dopant impurities of the first conductivity type (i.e., the same conductivity type as that of the active region) into the edges of channel region, but not into the central portion of channel region. According to one exemplary and advantageous embodiment, the halo implantation operation may introduce P-type dopant impurities although N-type dopant impurities may be implanted in other exemplary embodiments.

Figure 12:
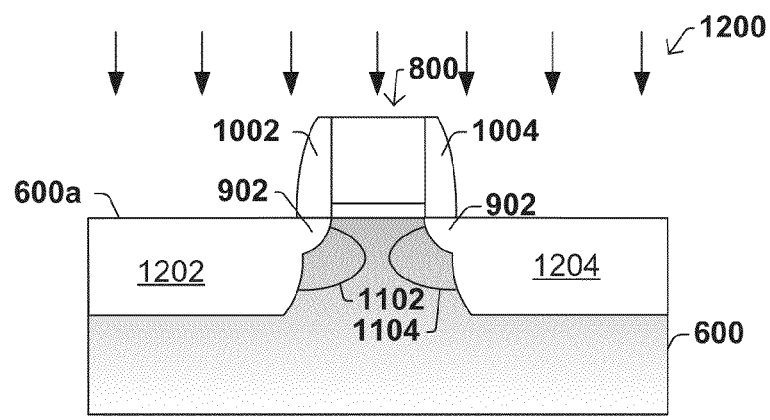

In FIG. 12, source/drain regions 1202, 1204 are formed by carrying out an ion implantation operation indicated by arrows 1200 or by epitaxial source/drain. Source/drains 1202, 1204 are formed of the same, second dopant impurity type as LDD regions 902, and according to one advantageous embodiment, LDD region 902 and source/drain regions 1202, 1204 are N-type regions.

Figure 13:
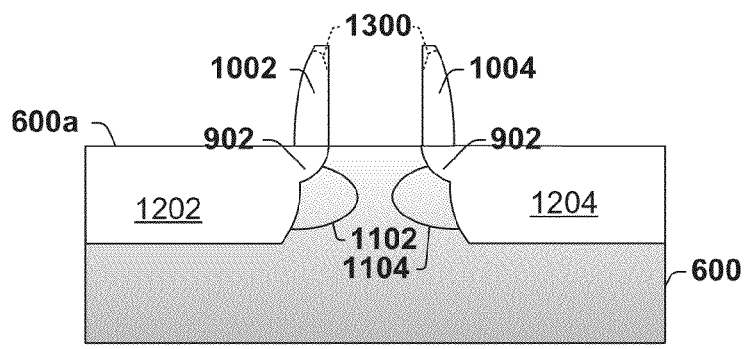

In FIG. 13, an etch is performed to remove the dummy gate structure 800. In some implementations, a first etch process can be used to remove the conductive gate electrode 802 and a second, different etch process can be used to remove the gate dielectric 804. The first and second etches can have different etch chemistries, different energies, different temperatures, different etch times, and so on. In some embodiments, the second etch can be selective between the gate dielectric and the underlying semiconductor substrate surface 600a. Although the sidewall spacers 1002 and 1004 are illustrated in FIG. 13 as retaining their shape after the dummy gate structure has been removed, often the removal of the dummy gate structure can also remove small portions of the sidewall spacers 1002, 1004. For example, as shown by dashed lines 1300, the etch or etches which remove the dummy gate structure and gate dielectric, may shorten the height of sidewall spacers and also erode inner sidewall portions of sidewall spacers. Often, upper inner sidewall portions of the sidewall spacers are more significantly eroded than lower inner sidewall portions of the sidewall spacers, due to their be exposed longer to the etch or etches compared to the lower portions of sidewall spacers. Outer sidewall portions of the sidewall spacers can also be eroded (not shown). The extent of erosion depends on the characteristics of the etch(es) as well as the materials selected for the sidewall spacers.

Figure 14:
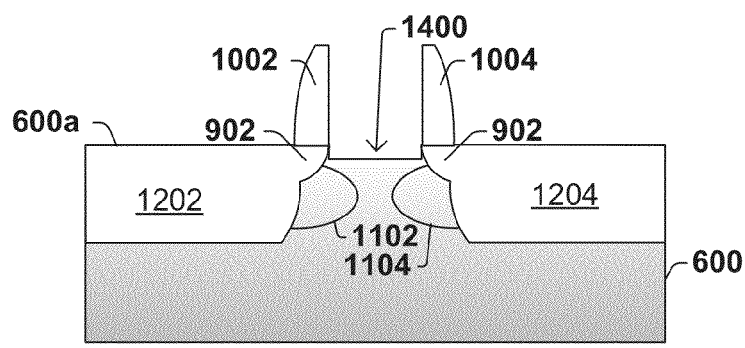

FIG. 14, an upper surface region of the channel region is removed to form a channel recess 1400. In some embodiments, the channel recess 1400 can have a height of between approximately 5 nm to approximately 10 nm. The channel recess 1400 can also have sidewalls that are aligned to inner sidewalls of spacers 1002, 1004.

Figure 15:
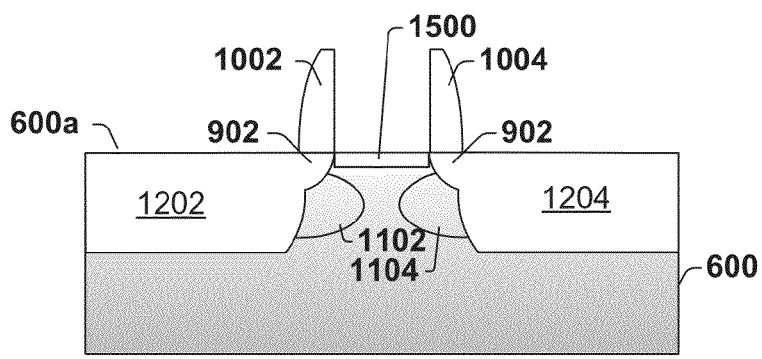

In FIG. 15, an epitaxial silicon layer 1500 is formed in the channel recess using epitaxial deposition or other suitable methods. In one embodiment, the epitaxial growth process is carried out at approximately 700° C. to approximately 800° C., for a time of approximately 100 seconds to approximately 150 seconds.

Figure 16:
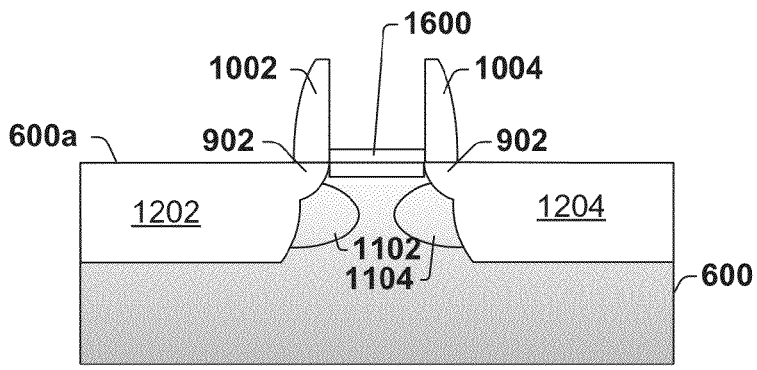

In FIG. 16, a gate dielectric 1600 is formed over the epitaxial silicon layer 1500.

Figure 17:
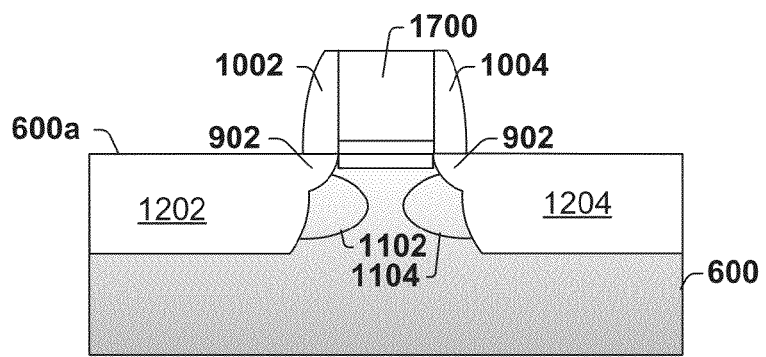

In FIG. 17, a replacement gate electrode 1700 is formed. In some embodiments the replacement gate electrode is polysilicon, but in other embodiments the replacement gate is metal. Because the epitaxially-grown replacement channel and replacement gate electrode are formed after the dummy gate is removed, the dummy gate electrode saves significant thermal stress from these components.

According to one aspect, the disclosure provides a method of forming a transistor. In this method, a dummy gate structure is formed over a semiconductor substrate. Source/drain regions are then formed in the semiconductor substrate such that a channel region, which is arranged under the dummy gate structure in the semiconductor substrate, separates the source/drains from one another. After the source/drain regions have been formed, the dummy gate structure is removed. After the dummy gate structure has been removed, a surface region of the channel region is removed to form a channel region recess. A replacement channel region is then epitaxially grown in the channel region recess.

Another aspect of the disclosure relates to a method of forming a transistor. In this method, a threshold voltage implant, which has a first conductivity type, is carried out to form an active region in a semiconductor substrate. A dummy gate structure is then formed over the active region. Lightly doped drain (LDD) regions are formed in the active region. The LDD regions are self-aligned to the dummy gate structure and have a second conductivity type opposite the first conductivity type. Sidewall spacers are formed about opposing sidewalls of the dummy gate structure. While the dummy gate structure and sidewall spacers are in place, an ion implantation operation or epitaxial silicon growth process is carried out to form source/drain regions. The source/drain regions are self-aligned to outer edges of the sidewall spacers and have the second conductivity type. Pocket implant regions are formed in the substrate by performing an angled implant while the dummy gate structure is in place. The pocket implant regions have the first conductivity type. After the source/drain regions have been formed, the dummy gate structure is removed. After the dummy gate structure has been removed, a recess is formed in the channel region. A replacement channel region is then epitaxially grown in the channel region recess.

Still another embodiment relates to an integrated circuit. The integrated circuit includes a semiconductor substrate, and source/drain regions arranged in the semiconductor substrate. A channel region is arranged in the semiconductor substrate so as to laterally space the source/drain regions from one another. The channel region includes an upper epitaxial replacement channel region and a lower substrate channel region. A replacement gate structure is arranged over the channel region. The replacement gate structure includes a conductive gate electrode and a gate dielectric which separates the gate conductive electrode from the channel region.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

What is claimed is:

1. A method, comprising:
   providing a dummy gate structure over a semiconductor substrate;
   forming source/drain regions in the semiconductor substrate such that a channel region, which is arranged under the dummy gate structure in the semiconductor substrate, separates the source/drains from one another;
   after the source/drain regions have been formed, removing the dummy gate structure;
   after the dummy gate structure has been removed, removing a surface region of the channel region to form a channel region recess; and
   epitaxially growing a replacement channel region in the channel region recess.

2. The method of claim 1, further comprising:
   after the replacement channel region has been epitaxially grown, forming a gate dielectric over the replacement channel region; and
   forming a replacement gate electrode over the gate dielectric.

3. The method of claim 1, wherein the channel region recess has a substantially constant depth across the entire channel region.

4. The method of claim 3, wherein the replacement channel region has a substantially constant depth of between approximately 5 nanometers and approximately 10 nanometers across the entire channel region.

5. The method of claim 2, wherein the epitaxially grown replacement channel region has a doping profile that increases by approximately a factor of ten for the first 10 nm of depth measured from an underside of the gate dielectric layer.

6. The method of claim 1, wherein the epitaxially grown replacement channel region meets a bulk substrate channel region at an interface at which a doping concentration is below $1 \times 10^{18}$.

7. A method, comprising:
   performing a threshold voltage implant, which has a first conductivity type, to form an active region in a semiconductor substrate;
   providing a dummy gate structure over the active region;
   forming lightly doped drain (LDD) regions in the active region, wherein the LDD regions are self-aligned to the dummy gate structure and have a second conductivity type opposite the first conductivity type;
   forming sidewall spacers about opposing sidewalls of the dummy gate structure;
   forming pocket implant regions in the substrate by performing an angled implant while the dummy gate structure is in place, the pocket implant regions having the first conductivity type;
   with the dummy gate structure and sidewall spacers in place, forming source/drain regions in the substrate, wherein the source/drain regions are self-aligned to outer edges of the sidewall spacers and have the second conductivity type;
   after the source/drain regions have been formed, removing the dummy gate structure;
   after the dummy gate structure has been removed, forming a recess in a channel region; and
   epitaxially growing a replacement channel region in the channel region recess.

8. The method of claim 7, further comprising:
   after the replacement channel region has been epitaxially grown, forming a gate dielectric over the replacement channel region; and
   forming a replacement gate electrode over the gate dielectric.

9. The method of claim 8, wherein the replacement gate structure comprises a polysilicon gate or a metal gate.

10. The method of claim 8, wherein the gate dielectric is a high-k gate dielectric.

11. The method of claim 7, wherein an etch to remove the dummy gate is a plasma etch.

12. The method of claim 7, wherein the epitaxial growth process for the replacement channel region is carried out at approximately 700° C. to approximately 900° C., for a time of approximately 100 seconds to approximately 150 seconds.

13. The method of claim 7, wherein the replacement channel region has a substantially constant depth of between approximately 5 nanometers and approximately 10 nanometers across the entire channel region.

14. The method of claim 7, wherein the epitaxially grown replacement channel region has a doping profile that increases by approximately a factor of ten for the first 10 nm of depth measured from an underside of the gate dielectric layer.

15. The method of claim 7, wherein the epitaxially grown replacement channel region meets a bulk substrate region at an interface at which a doping concentration is below $1 \times 10^{18}$.

16. The method of claim 7, wherein the dummy gate structure comprises a polysilicon gate electrode.

17. A method for forming a transistor, comprising:
forming an active region having a first conductivity type in a semiconductor substrate;
forming a dummy gate structure over the active region;
forming sidewall spacers about opposing sidewalls of the dummy gate structure;
forming source/drain regions having a second conductivity type in the substrate about outer edges of the sidewall spacers, wherein the source/drain regions are spaced apart from one another by a channel region in the semiconductor substrate;
after the source/drain regions have been formed, removing the dummy gate structure;
after the dummy gate structure has been removed, forming a recess in the channel region from an upper surface of the semiconductor substrate; and
epitaxially growing a replacement channel region in the recess.

18. The method of claim 17, wherein the recess is self-aligned by the sidewall spacers.

19. The method of claim 17, wherein the replacement channel region is formed to fill the recess and has an upper surface co-planar with the upper surface of the semiconductor substrate.

20. The method of claim 17, wherein the replacement channel region has an average doping concentration ten times greater than that of an interface region of the semiconductor substrate that is neighbored to the replacement channel region.

* * * * *